US010217842B2

(12) United States Patent
Reboh et al.

(10) Patent No.: US 10,217,842 B2
(45) Date of Patent: Feb. 26, 2019

(54) METHOD FOR MAKING A SEMICONDUCTOR DEVICE WITH SELF-ALIGNED INNER SPACERS

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Emmanuel Augendre, Montbonnot (FR); Remi Coquand, Les Marches (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/837,405

(22) Filed: Dec. 11, 2017

(65) Prior Publication Data
US 2018/0175167 A1    Jun. 21, 2018

(30) Foreign Application Priority Data

Dec. 15, 2016  (FR) ..................................... 16 62531

(51) Int. Cl.
*H01L 21/00*    (2006.01)
*H01L 29/66*    (2006.01)
(Continued)

(52) U.S. Cl.
CPC .. *H01L 29/66553* (2013.01); *H01L 21/02236* (2013.01); *H01L 21/02238* (2013.01);
(Continued)

(58) Field of Classification Search
CPC ........... H01L 29/66553; H01L 29/6681; H01L 29/0673; H01L 29/42392; H01L 29/7853;
(Continued)

(56) References Cited

U.S. PATENT DOCUMENTS 9,219,154 B1   12/2015  Cheng et al.
2002/0177282 A1*  11/2002  Song ................. H01L 29/42384
                                                              438/300
(Continued)

OTHER PUBLICATIONS

U.S. Appl. No. 14/555,897, filed Nov. 28, 2014, 2015/0155170 A1, Shay Reboh et al.
(Continued)

*Primary Examiner* — Richard A Booth
(74) *Attorney, Agent, or Firm* — Oblon, McClelland, Maier & Neustadt, L.L.P.

(57) ABSTRACT

A method for making a semiconductor device, including:
a) making, on a substrate, a stack comprising a first semiconductor portion able to form an active zone and arranged between two second portions of a material able to be selectively etched relative to the semiconductor of the first portion,
b) making, on a part of the stack, outer spacers and a dummy gate,
c) etching the second portions such that remaining parts are arranged under the dummy gate,
d) partially oxidizing the remaining parts from the outer faces, forming inner spacers,
e) removing the dummy gate and non-oxidized parts of the remaining parts arranged under the dummy gate,
f) making a gate between the outer spacers and between the inner spacers and covering the channel.

13 Claims, 11 Drawing Sheets

(51) Int. Cl.
| | |
|---|---|
| *H01L 29/06* | (2006.01) |
| *H01L 29/423* | (2006.01) |
| *H01L 29/78* | (2006.01) |
| *H01L 21/02* | (2006.01) |
| *H01L 29/786* | (2006.01) |

(52) U.S. Cl.
CPC .... *H01L 21/02255* (2013.01); *H01L 29/0673* (2013.01); *H01L 29/42392* (2013.01); *H01L 29/6653* (2013.01); *H01L 29/6656* (2013.01); *H01L 29/6681* (2013.01); *H01L 29/66818* (2013.01); *H01L 29/7853* (2013.01); *H01L 29/78696* (2013.01)

(58) Field of Classification Search
CPC ............. H01L 29/6653; H01L 29/6656; H01L 21/02236; H01L 21/02238; H01L 21/02255
See application file for complete search history.

(56) References Cited

U.S. PATENT DOCUMENTS

| | | | |
|---|---|---|---|
| 2006/0172468 | A1 | 8/2006 | Orlowski |
| 2007/0145431 | A1* | 6/2007 | Kim .................. H01L 29/42392 257/288 |
| 2011/0254013 | A1* | 10/2011 | Xiao ...................... H01L 21/84 257/76 |
| 2014/0001441 | A1 | 1/2014 | Kim et al. |
| 2014/0054724 | A1 | 2/2014 | Ching et al. |
| 2014/0339507 | A1 | 11/2014 | Leobandung |
| 2015/0084041 | A1 | 3/2015 | Hur et al. |
| 2016/0027929 | A1 | 1/2016 | Cheng et al. |

OTHER PUBLICATIONS

U.S. Appl. No. 14/575,329, filed Dec. 18, 2014, 2015/0179474 A1, Sylvain Maitrejean et al.
U.S. Appl. No. 14/901,027, filed Dec. 28, 2015, 2016/0372362 A1, Thomas Signamarcheix et al.
U.S. Appl. No. 14/950,416, filed Nov. 24, 2015, 2016/0149039 A1, Shay Reboh et al.
U.S. Appl. No. 15/049,468, filed Feb. 22, 2016, 2016/0254362 A1, Sylvain Maitrejean et al.
U.S. Appl. No. 15/070,781, filed Mar. 15, 2016, 2016/0276494 A1, Sylvain Barraud et al.
U.S. Appl. No. 15/092,002, filed Apr. 6, 2016, 2016/0300927 A1, Shay Reboh et al.
U.S. Appl. No. 15/261,226, filed Sep. 9, 2016, 2017/0076997 A1, Shay Reboh et al.
U.S. Appl. No. 15/352,198, filed Nov. 15, 2016, 2017/0141212 A1, Sylvain Barraud et al.
U.S. Appl. No. 15/490,212, filed Apr. 18, 2017, 2017/0309483 A1, Shay Reboh et al.
U.S. Appl. No. 15/457,447, filed Mar. 13, 2017, 2017/0263495 A1, Emmanuel Augendre et al.
U.S. Appl. No. 15/452,049, filed Mar. 7, 2017, 2017/0263607 A1, Sylvain Maitrejean et al.
U.S. Appl. No. 15/523,742, filed May 2, 2017, Shay Reboh et al.
U.S. Appl. No. 15/602,829, filed May 23, 2017, 2017/0345931 A1, Shay Reboh et al.
U.S. Appl. No. 15/603,738, filed May 24, 2017, 2017/0345915 A1, Remi Coquand et al.
U.S. Appl. No. 15/711,549, filed Sep. 21, 2017, Shay Reboh et al.
French Preliminary Search Report dated Aug. 9, 2017 in French Application 16 62531 filed on Dec. 15, 2016 (with English Translation of Categories of Cited Documents).
C. H. Lee et al., "Selective $GeO_x$-Scavenging from Interfacial Layer on $Si_{1-x}Ge_x$ Channel for High Mobility Si/ $Si_{1-x}Ge_x$ CMOS Application," 2016 Symposium on VLSI Technology Digest of Technical Papers, 2016, pp. 2.
E. A. Lewis et al., "The Effect of Surface Orientation on Silicon Oxidation Kinetics", J. Electrochemical Society, vol. 134, No. 9, Sep. 1987, pp. 8.

* cited by examiner

METHOD FOR MAKING A SEMICONDUCTOR DEVICE WITH SELF-ALIGNED INNER SPACERS

TECHNICAL FIELD AND PRIOR ART

The invention relates to a method for making a semiconductor device comprising one or more transistors, for example of the GAA-FET ("Gate-All-Around Field Effect Transistor") type, and inner spacers being self-aligned with respect to each other.

In a GAA-FET-type transistor, the gate of the transistor is made all around the channel such that the channel is surrounded or encapsulated by the gate. Such a transistor has the advantage, in comparison with a conventional MOSFET transistor, of improving the electrostatic control of the channel by the gate (which enables the leakage currents to be reduced), in particular when the transistor is fully depleted (for example of the FD-SOI, or Fully-Depleted Silicon On Insulator, type).

It is known to make a GAA-FET-type transistor comprising a stack of several semiconductor nanowires forming the channel of the transistor together. This configuration makes it possible to achieve a good compromise between electrostatic control of the channel by the gate and control current necessary in the transistor.

Adding a stress in the transistor channel contributes to the improvement of the transistor performance. This stress is preferably uniaxial and parallel to the direction of movement of the carriers in the channel. A compressive applied to the channel enables the carrier mobility to be improved in a P-type transistor, whereas a tensile stress has a beneficial effect in an N-type transistor.

Document US 2014/0054724 A1 describes a method for making a GAA-FET transistor. In such a transistor, the electrical insulation between the gate and the source and drain regions is ensured by outer spacers formed on the initial stack of materials which is used for making the active zone of the transistor, as well as inner spacers made within this stack. These inner spacers are necessary to reduce the capacitive effects between the gate and the source and drain regions. In this document, the inner spacers are made by etching, in the semiconductor located against the channel nanowire(s), one or more cavities intended to be vertically aligned relative to the outer spacers, and then by making an oxidation of the semiconductor walls of the cavity (cavities) formed. This cavity (cavities) is (are) then filled with the gate materials (dielectric+conductive material).

The method described in this document however raises a problem. Indeed, given that the cavity (cavities) formed within the stack for making inner spacers is (are) obtained by etching without a barrier layer, the alignment attempted between the inner edges of the outer spacers and the side walls of the cavities is hard to be obtained because it depends on the duration for implementing the etching. In practice, the inner spacers obtained with this method are neither accurately aligned with the outer spacers, nor above one another. This represents a variability source of the electrical characteristics of a transistor thus made, in particular because the variations in the dimensions of the inner spacers have a direct influence on the channel length.

Document US 2014/0001441 A1 describes another method for making a GAA-FET transistor. In this method, making spacers includes implementing an etching, at the source and drain regions and up to under outer spacers, of sacrificial layers located between the nanowires intended to form the channel, source and drain regions of the transistor. A material with particular properties is then deposited into the spaces etched, and then a step of transforming and/or etching the portions of this material located outside locations provided for the inner spacers is then implemented such that the remaining parts of this material form the inner spacers. The transistor is completed by forming the final gate of the transistor.

Once again, making the cavities in which the inner spacers are formed involves the implementation of an etching without a barrier layer. The alignment attempted between the channel region and the walls of the cavities is hard to be achieved. In practice, the inner spacers obtained are not accurately aligned neither with the outer spacers, nor with the channel region, nor the one with respect to the other. This represents a variability source in the electrical characteristics of the transistor thus made, in particular because the variations in the dimensions of the inner spacers have a direct influence on the channel length which is obtained. In addition, for making spacers, this method resorts to a particular material the nature of which is not identifiable.

DISCLOSURE OF THE INVENTION

Thus there is a need to provide a method for making a semiconductor device adapted to make a GAA-FET transistor and the inner spacers of which are made in a self-aligned manner the one with respect to the other.

For this, one embodiment provides a method for making a semiconductor device, including at least the implementation of the following steps:

a) making, on a substrate, a stack comprising at least one first semiconductor portion arranged between at least two second portions of at least one material able to be selectively etched relative to the semiconductor of the first portion, the first portion being able to form at least one active zone of the semiconductor device;

b) making, on a part of the stack, outer spacers and of at least one dummy gate arranged between the outer spacers;

c) etching the second portions such that remaining parts of the second portions are arranged at least under the dummy gate;

d) partially oxidising the remaining parts of the second portions from outer faces of the remaining parts of the second portions which are obtained by etching the second portions, forming inner spacers;

e) removing the dummy gate and the non-oxidised parts of the remaining parts of the second portions arranged at least under the dummy gate;

f) making a gate between the outer spacers and between the inner spacers, covering the channel and able to be electrically insulated from source and drain regions by the outer spacers and by the inner spacers.

Thus, the surfaces from which the inner spacers are made correspond to the surfaces revealed by, or appearing after, etching the second portions by using the dummy gate, and possibly the outer spacers, as an etching mask. Thus, these surfaces are aligned with respect to each other, which enables a self-alignment of the inner spacers to be achieved between each other, and with respect to the outer spacers when the outer spacers are present upon etching the second portions. This self-alignment is achieved regardless of the number of first semiconductor portions used to make the channel.

With such a method, the self-aligned making of the inner spacers may be carried out such that it does not modify the channel length of the semiconductor device and has no impact on the electrical performance of the semiconductor device.

The inner spacers correspond to the elements intended to electrically insulate the gate relative to the source and drain regions within the stack from which the semiconductor device is made. The inner spacers are arranged above and below the source and drain extension regions.

The outer spacers correspond to the elements intended to electrically insulate the gate relative to the source and drain regions above the stack from which the semiconductor device is made. The outer spacers cover at least part of the source and drain extension regions.

In addition, with respect to inner spacers which would be made by depositing a material in cavities formed by etching, the implementation of an oxidation to form the inner spacers has the advantage of reducing the implementation requirements for making these inner spacers, as for example the dimensions or aspect ratio of the inner spacers that can be made, because making inner spacers by deposition imposes requirements on the thickness of the material deposited with respect to the dimensions of the locations of the inner spacers. In addition, making the inner spacers by depositing a dielectric material also imposes implementing a step of etching the dielectric material deposited outside the locations provided for the inner spacers. Such a removal step is not necessarily implemented when the inner spacers are made by oxidation because oxide is not formed on all the materials present.

Further, upon making several devices very close to each other, making inner spacers through a dielectric material deposition is difficult, unlike making the inner spacers by oxidation.

This method is also well adapted to the collective making of several transistors having different channel lengths one to each other because even if the channel width is high, the channel is not etched.

According to first and second embodiments, the method may be such that:
step c) of etching is implemented such that the remaining parts of the second portions are also arranged under the outer spacers;
the inner spacers are arranged at least partially under the outer spacers.

In these first and second embodiments, the dummy gate and the outer spacers form together an etching mask used for defining the surfaces from which the inner spacers are formed by oxidation. Thus, the inner spacers which are formed may be arranged at least partially under the outer spacers.

In this case, the method may further include, between steps d) and e), making the source and drain regions by epitaxially growing a semiconductor from at least parts of the first semiconductor portion.

According to the first and second embodiments, implementing step c) may also etch the first semiconductor portion such that a remaining part of the first semiconductor portion arranged at least under the dummy gate is preserved.

According to the second embodiment:
step b) may be implemented such that at least two dummy gates are made on the stack, each of the dummy gates being arranged between outer spacers;
step c) may be implemented such that at least part of the first semiconductor portion located between both dummy gates is not etched.

Thus, the part of the first semiconductor portion located between both dummy gates can be used to form a continuous active zone for at least two transistors arranged next to each other and sharing a same source and drain region (forming the source for one of both transistors and the drain for the other transistor). In this configuration, properties of the semiconductor of the first portion (for example the presence of dopants and/or chemical components) can be used upon making the common source and drain region, for example to introduce a stress in the semiconductor of the source and drain region.

Adding the stress in the channel contributes to improving the transistor performance. This stress is preferably uniaxial and parallel to the direction of movement of the carriers in the channel. When the semiconductor device corresponds to an N-type transistor, this stress may correspond to a tensile stress applied to the channel, which enables the carrier mobility to be improved in the transistor. When the semiconductor device corresponds to a P-type transistor, this stress may correspond to a compressive stress.

According to a third embodiment:
the method may further include, between steps b) and c), implementing a deposition of a protective material covering parts of the stack which are not covered with the dummy gate and with the outer spacers, and then removing, for example an etching, of the outer spacers, named first outer spacers;
implementing step c) also etches parts of the first semiconductor portion previously arranged under the first outer spacers;
implementing step d) also makes a partial oxidation of second remaining parts of the second portions covered with the protective material from outer faces of the second remaining parts of the second portions revealed by, or appearing after, etching the second portions;
and the method may further include, between steps d) and e), implementing the following steps:
epitaxially growing a semiconductor at least between a first part of the first semiconductor portion arranged under the dummy gate and second parts of the first semiconductor portion which are arranged under the protective material, forming source and drain extension regions, and then
making second outer spacers at least on the source and drain extension regions, and then
removing the protective material and the second remaining parts of the second portions, and then
making the source and drain regions by epitaxially growing a semiconductor from at least the second parts of the first semiconductor portion.

In this third embodiment, the method may further include, between the step of removing the protective material and the step of making the source and drain regions, a step of removing at least part of oxidised portions from the second portions covered with the protective material. On the other hand, these oxidised portions from the second portions covered with the protective material are advantageously preserved when cavities are present in the source and drain extension regions, under the outer spacers.

For all the embodiments, step d) of oxidation may also make a partial oxidation of the first semiconductor portion, and the method may further include, between steps d) and e), implementing an etching of oxidised parts of the first semiconductor portion.

Further, the material of the second portions may be able to be oxidised more quickly than the semiconductor of the first portion. Thus, the impact on the first portion of the oxidation implemented to form the inner spacers is minimised. When the material of the second portions is able to be oxidised more quickly than the semiconductor of the first portion, this oxidised part of the first semiconductor portion may thereby be etched in order to limit oxidation impact on the first semiconductor portion.

In this case, the semiconductor of the first portion may be silicon or SiGe, and the material of the second portions may be SiGe including a germanium proportion higher than that of the semiconductor of the first portion.

Thus, the difference in oxidation rate between the semiconductor of the first portion and that of the second portions may be advantageously achieved thanks to the difference in concentrations, or proportions, of germanium in the semiconductors (the one having the highest germanium concentration being oxidised more quickly than the other semiconductor).

Advantageously, the semiconductor of the source and drain regions may be compressive stressed SiGe when the semiconductor device corresponds to a P-type transistor.

The stack may include several first semiconductor portions each forming a nanowire arranged between two second portions.

The semiconductor device advantageously includes at least one GAA-FET transistor.

BRIEF DESCRIPTION OF THE DRAWINGS

The present invention will be better understood upon reading the description of exemplary embodiments given by way of purely indicating and in no way limiting purposes making reference to the appended drawings in which.

Identical, similar or equivalent parts of the different Figs. described hereinafter bear the same numeral references so as to facilitate switching from one Fig. to the other.

The different parts shown in the Figs. are not necessarily drawn to a uniform scale, to make the Figs. more readable.

The different possibilities (alternatives and embodiments) should be understood as being not exclusive to each other and can be combined with each other.

DETAILED DISCLOSURE OF PARTICULAR EMBODIMENTS

FIGS. 1A to 1G are first referred to which show the steps of a method for making a semiconductor device 100 including herein two P-type GAA-FET transistors, according to a first embodiment.

Figure 1A:
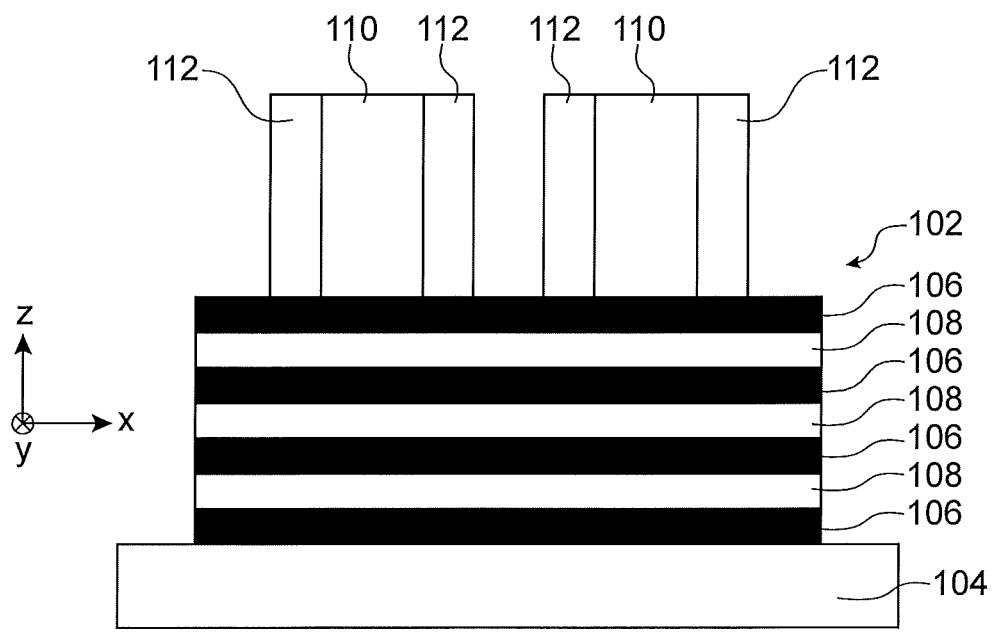
FIGS. 1A to 1G show the steps of a method for making a semiconductor device according to a first embodiment.

As shown in FIG. 1A, the device 100 is made from a stack 102 of layers of different materials which is arranged on a substrate 104. In the first embodiment described here, the substrate 104 corresponds to a "bulk" semiconductor substrate, for example of silicon or SiGe. The stack 102 comprises layers 106, 108 of two different materials and alternately arranged above each other. Each of the layers 108 is intended to form one or more semiconductor nanowires of one or more channels of the device 100 and is arranged between two layers 106 including a material able to be selectively etched relative to that of the layers 108. In the first embodiment described herein, the stack 102 includes three layers 108 as well as four layers 106 alternately arranged such that each of the layers 108 is arranged between two layers 106.

Alternatively, the substrate which is used may correspond to a SOI (Silicon On Insulator) substrate, with in this case reference 104 which designates the buried dielectric layer, or BOX ("Buried Oxide") of the SOI substrate and the first layer 106 (that arranged against the layer 104) which designates the superficial layer, or thin layer, of the SOI substrate. Alternatively, the first layer 106 can correspond to a layer other than the superficial layer of a SOI substrate, for example a SiGe layer obtained by condensation.

The term nanowire is used herein to designate any material portion with nanoscale, or even microscale dimensions, and having an elongate shape, regardless of the cross-section shape of this portion. Thus, this term designates both circular and substantially circular cross-section elongate material portions, and beam or bar shaped material portions including for example a rectangular or substantially rectangular cross-section.

In the first embodiment described herein, the layers 108 include silicon, and the layers 106 include SiGe with a germanium proportion for example between about 10% ($Si_{0.9}Ge_{0.1}$) and 80% ($Si_{0.2}Ge_{0.8}$). The substrate 104 includes a bulk layer, for example of silicon, on which a relaxed SiGe layer (also named SRB or "Strain Relaxed Buffer") or stressed SiGe layer is arranged.

The stack 102 is etched as one or more elongate portions. The width of this(se) portion(s) (which corresponds to the dimension along the axis Y shown in FIG. 1A) is equal to the desired width of the nanowires of the device 100 which will be formed by the portions of the subsequently obtained layers 108.

One or more dummy gates 110 are then made, for example by lithography and etching, on the elongate portion(s) formed from the stack 102, at the locations for the future gates of the device 100. In FIG. 1A, two dummy gates 110 are made. The dummy gates 110 are arranged above the parts of the layers 108 intended to form the nanowires, that is the channels of the device 100, and parts of the layers 106 between which these parts of the layers 108 are located, and also cover side flanks of these parts of the layers 108 and 106.

Outer spacers 112 are then made, for example by deposition and etching, on the stack 102, and against the side flanks of the dummy gate 110. These outer spacers 112 are in particular arranged above parts of the layers 108 for intended to be located in the source and drain extension regions, that is between the channel and the source and drain regions of the device 100. The length, or depth, of these outer spacers 112 (dimension parallel to the axis X shown in FIG. 1A) is for example between about 3 and 8 nm.

Figure 1B:
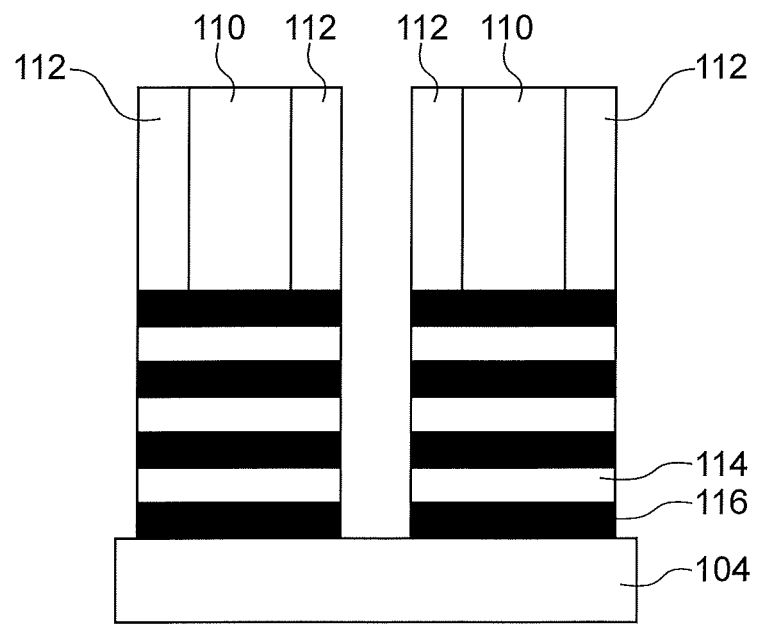

The parts of the stack 102 which are not covered with the dummy gate 110 and with the outer spacers 112 are then etched, forming the structure shown in FIG. 1B. The remaining portions of the layers 108 form nanowires 114 of the device 100. Each of the nanowires 114 is interposed between two remaining portions 116 of the layers 106.

In this first embodiment, inner spacers of the device 100 are intended to be made by oxidation of part of the remaining portions 116, from outer faces of these portions 116 obtained by the previous etching implemented using the dummy gates 110 and the outer spacers 112 as an etching mask. The oxidised portions obtained are intended to form inner spacers ensuring, with the outer spacers 112, insulation of the gates relative to the source and drain regions.

This oxidation will also impact the semiconductor of the nanowires 114. For the implementation of this oxidation not to transform into oxide all of the semiconductor of the nanowires 114, the material of the portions 116 (and thus that of the layers 106) is chosen such that its oxidation rate is higher than that of the material of the nanowires 114 (and thus of the layers 108). Thus, in the exemplary embodiment described herein, this property is achieved by virtue of making the silicon layers 108 and the SiGe layers 106 with a germanium concentration between for example about 30% and 60%.

The higher the germanium concentration in the SiGe of the portions 116, the quicker this semiconductor will be oxidised with respect to the semiconductor of the nanowires 114, and/or the lower the temperature at which the oxidation is implemented. A high selectivity provides in particular a greater freedom in choosing the duration and temperature for implementing the oxidation.

Figure 1C:
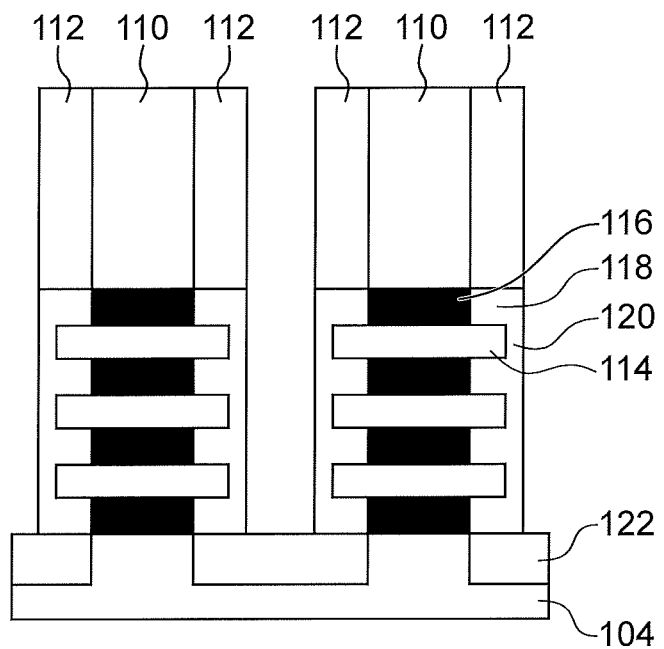

A partial oxidation of the portions 116, from the surfaces forming the side flanks of the structures obtained by implementing the previous etching, is then implemented. This oxidation forms, at the future source and drain extension regions (that is under the outer spacers 112), inner spacers 118 comprising a dielectric material and intended to insulate the source and drain regions relative to the gate which will be subsequently made (FIG. 1C).

The length, or depth (dimension parallel to the axis X), of each inner spacer 118 is here substantially equal to that of each outer spacer 112 such that in the following of the method, the outer 112 and inner 118 spacers are aligned with respect to the gate.

During this oxidation, part of the nanowires 114 is oxidised. The oxidised portions of the nanowires 114 are designated in FIG. 1C by reference 120. However, because of the materials used (silicon nanowires 114 and SiGe source and drain regions 118, 120), the oxidation of the nanowires 114 is slower than that of the portions 116. In the first embodiment described herein, this difference in oxidation rate is due to the high germanium concentration in the portions 116, which enables a quicker SiGe oxidation than that of the silicon of the nanowires 114. For example, considering SiGe the germanium concentration of which is equal to about 50% ($Si_{0.5}Ge_{0.5}$) and an oxidation forming an oxide with a thickness equal to about 10 nm, the oxide thickness obtained by implementing this oxidation on silicon is between about 1 nm and 6 nm (a thickness varying in particular depending on whether a native oxide is present at the surface of the silicon of the nanowires 114, or the nanowires 114 have undergone a deoxidation beforehand, for example with an HF solution, removing this native oxide).

Preferably, this oxidation is implemented at a low temperature between about 700° C. and 900° C., for example lower than about 850° C., in order to enhance oxidation selectivity obtained thanks to the different compositions of the materials exposed to the oxidation methods.

In some cases, higher temperatures can however be contemplated because an increase in the temperature for implementing the oxidation allows a quicker oxidation of the materials. For example, by implementing the oxidation at a temperature of about 1100° C. on $Si_{0.5}Ge_{0.5}$, an oxide thickness of about 8 nm is achieved after 1 second of oxidation, the oxide thickness formed on silicon being 4 nm for a same oxidation duration.

This oxidation is for example a plasma assisted oxidation or a dry oxidation in the presence of dioxygen, or even an annealing under oxidising atmosphere.

The parameters for implementing this oxidation are preferably chosen such that the interfaces between the inner spacers 118 formed and the remaining portions 116 are substantially aligned with the interfaces between the outer spacers 112 and the dummy gates 110, that is such that the internal flanks of the inner spacers 118 are aligned with respect to the internal flanks of the outer spacers 112. Further, these interfaces of the inner spacers 118 are self-aligned with respect to each other and aligned above each other because the inner spacers 118 are formed by a same step of oxidising the portions 116 which include a same material.

In the first embodiment described herein, given that the material of the substrate 104 on which the stack 102 is located is SiGe, a part 122 of the thickness of SiGe 104 is also transformed into oxide. The thickness of the part 122 is in particular a function of the nature of the material undergoing the oxidation, and in particular here a function of the germanium concentration of SiGe. Such an oxidation also occurs when the substrate 104 includes silicon.

Then, the oxidised portions 120 formed at the ends of the nanowires 114 are removed by etching. When the germanium oxide is removed, it is possible to implement a method as described in the document "Selective $GeO_X$-Scavenging from Interfacial Layer on $Si_{1-x}Ge_X$ Channel for High Mobility Si/$Si_{1-x}Ge_X$ CMOS Application" by C. H. Lee and al., 2016 Symposium on VLSI Technology Digest of Technical Papers, pages 36-37.

Figure 1D:
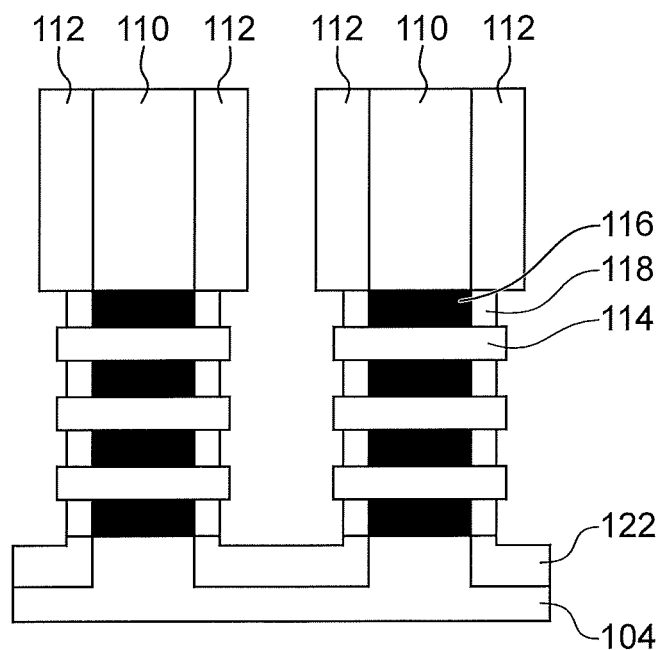

This etching also impacts the semiconductor oxide of the inner spacers 118 and the oxide formed in the substrate 104, and thus also removes a similar oxide thickness of the inner spacers 118 and the substrate 104 (FIG. 1D). At the end of this etching, the ends of the nanowires 114 are no longer covered with the oxide, and the inner spacers 118 have a length, or depth, typically corresponding to the difference between the initial length of the inner spacers 118 and the oxide thickness removed formed on the ends of the nanowires 114, and for example between about 1 nm and 2.5 nm.

Thus, because the inner spacers 118 have been formed by implementing a same oxidation step and that the oxide thickness removed thereafter is similar for all the inner spacers 118, the inner spacers 118 obtained at the end of these steps are actually self-aligned with respect to each other.

Figure 1E:
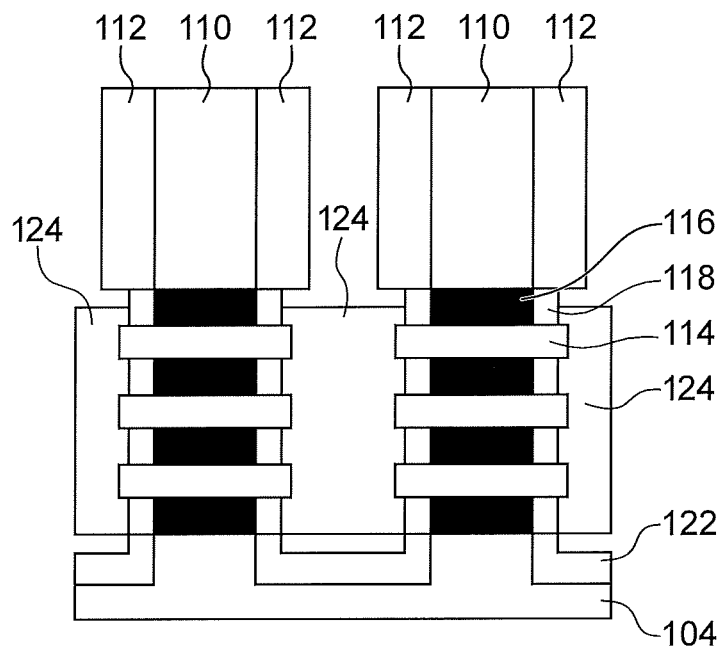

As shown in FIG. 1E, source and drain regions 124 are then formed by epitaxial growth on the substrate 104, from the ends of the nanowires 114. These regions 124 are made with an in situ doping so as to obtain a good junction quality. For example, the doping of the material of the regions 124 can be made with boron dopant atoms the concentration of which is for example between about $10^{18}$ and $10^{21}$ at/$cm^3$. The material of the source and drain regions 124 is for example SiGe:B or Si:B. Further, in the first embodiment described here, the two GAA-FET transistors of the device 100 include a common source and drain region 124 forming for one of both transistors a source region, and for the other of both transistors a drain region.

At this stage, the inner spacers 118 are interposed between the source and drain regions 124 and the portions 116.

In the first embodiment described here, the source and drain regions 124 include Si or SiGe. The germanium concentration of the SiGe of the source and drain regions 124 is for example between about 20% ($Si_{0.8}Ge_{0.2}$) and 80% ($Si_{0.2}Ge_{0.8}$). Generally, in a P-type transistor, the germanium concentration in the semiconductor of the source and drain regions 124 can be higher than that in the semiconductor of the nanowires 114.

A packaging material 126 is then deposited onto the source and drain regions 124 in order not to alter these regions upon implementing the subsequent steps.

Figure 1F:
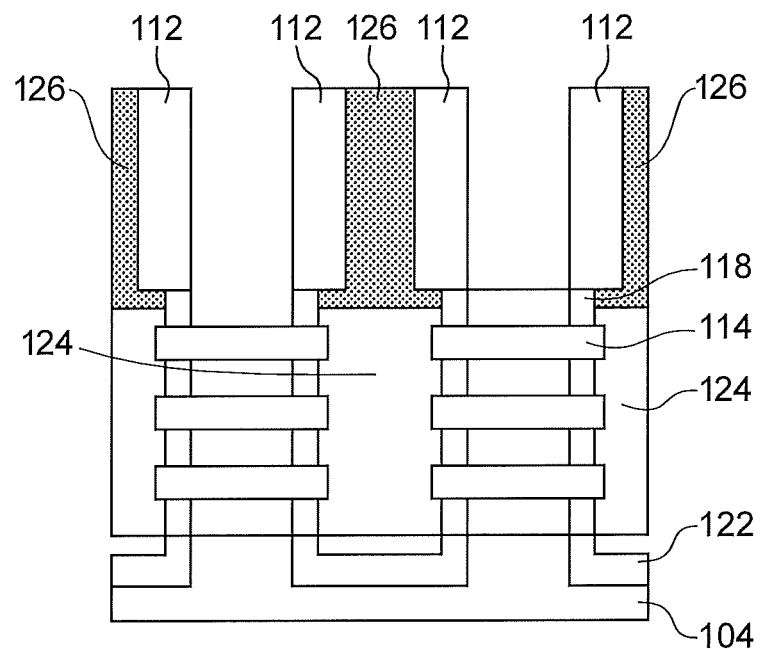

The dummy gate 110 is then etched, revealing the nanowires 114 and also forming accesses to the portions 116. A selective etching of the remaining portions 116 relative to the nanowires 114, the inner spacers 118 and the outer spacers 112 is then implemented in order to release the nanowires 114 forming the channels of the device 100 (FIG. 1F). This etching corresponds for example to a chemical etching HCl/H$_2$. This etching reveals the self-aligned walls with respect to each other of the inner spacers 118.

Gates 128, including at least one gate dielectric and one gate conductive material, are then made between the outer spacers 112 and the inner spacers 118, at the locations previously occupied by the dummy gates 110. The gates 128 thus made surround the nanowires 114 and are electrically insulated from the source and drain regions 124 by the inner spacers 118.

Thus, the inner spacers 118 enable capacity effects to be reduced between the gates 128 and the source and drain regions 124.

Figure 1G:
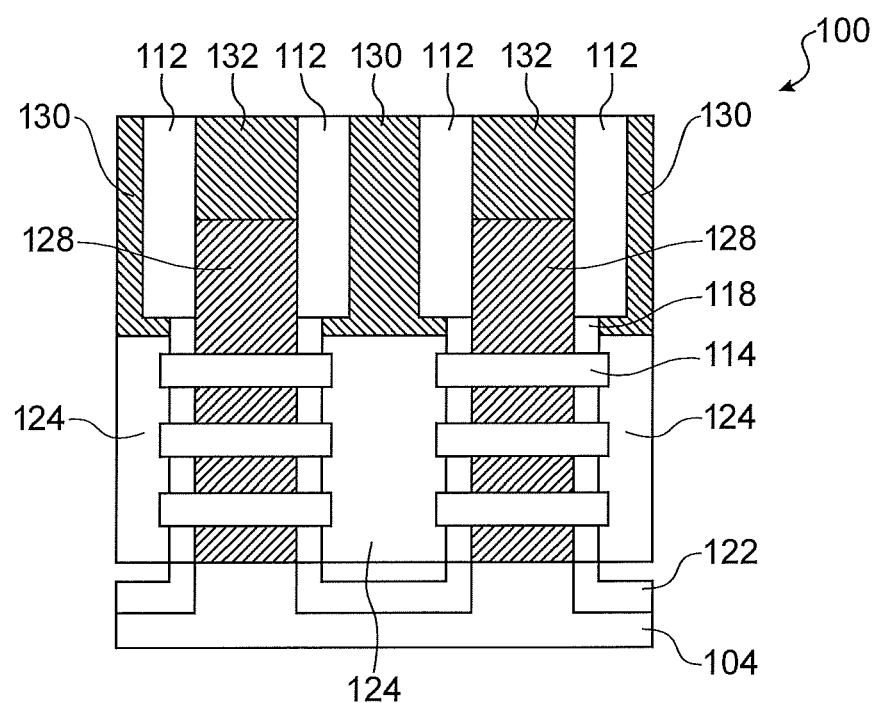

The device 100 is completed by removing the packaging material 126 and by forming electrical contacts 130 and 132 on the source and drain regions 124 and on the gate 128 (FIG. 1G).

In the first embodiment previously described, a part of the material of the substrate 104 exposed to the oxidation is transformed into oxide. Alternatively, it is possible that the substrate corresponds to a SOI (Silicon On Insulator) substrate, with in this case the reference 104 which designates the buried dielectric layer, or BOX ("Buried Oxide") of the SOI substrate and the first layer 106 (that arranged against the layer 104) which designates the superficial layer, or thin layer, of the SOI substrate. In this alternative, the layer 122 is not formed in the substrate 104 during the oxidation implemented because the material of the substrate exposed to the oxidation is oxide. Generally, it is possible to involve a substrate 104 the material of which is not likely to be oxidised, and no part of the substrate 104 is in this case transformed into oxide.

In an alternative to this first embodiment, when the substrate 104 corresponds to a silicon substrate, the thickness of the layer 122 formed is much lower than the case of a substrate 104 including SiGe.

According to an alternative to the method described above, it is possible to implement first the steps described in connection with FIGS. 1A and 1B. Then, it is possible to selectively etch the portions 116 relative to other materials which are present (this selective etching can be made by virtue of the fact that the germanium concentration in the semiconductor of the layers 106 is higher than that in the semiconductor of the layers 108), thereby forming cavities between which the nanowires 114 are located. A material able to be selectively etched relative to the nanowires 114, to the future inner spacers and to the outer spacers 112, is then deposited into these cavities, forming portions between which the nanowires 114 are disposed. Thus, the material of the initial stack located between the nanowires 114 is replaced with another material. This alternative can thus be implemented when the desired material between the nanowires 114 cannot be obtained upon making the initial stack of the layers 106, 108. This replacement material corresponds for example to a semiconductor such as SiGe with a high germanium concentration, or even germanium. For example, when the source and drain regions of the device 100 are intended to be subsequently made of SiGe, the germanium concentration in SiGe which corresponds to this replacement material can be higher by about 20% with respect to that of SiGe of the source and drain regions. In this case, the portions of this replacement material can be formed through a selective deposition method such that this material is only deposited about the nanowires 114, or even by a deposition and then an anisotropic RIE etching. The method is then completed by implementing the steps previously described in connection with FIGS. 1C to 1G.

According to an alternative embodiment, it is possible that the source and drain regions 124 are obtained by implementing several epitaxial growths enabling materials of different compositions (for example by varying the germanium concentration between the epitaxial growths) and/or with different dopant concentrations to be epitaxially grown. For example, making the source and drain regions 124 can include implementing a first SiGe epitaxial growth including carbon atoms, and then a second SiGe epitaxial growth not including carbon atoms. Thus, because the epitaxial growth is implemented with an in situ doping of the source and drain regions 124 which are formed, the initially formed SiGe portion comprising carbon atoms enables diffusion of dopants to be reduced in the channel regions of the device 100.

The characteristics of the oxidation implemented can also be a function of the crystalline orientation of the semiconductors being used, as described for example in the document "The Effect of Surface Orientation on Silicon Oxidation Kinetics" by E. A. Lewis and al., J. Electrochem. Soc. 1987, vol. 134, issue 9, pp. 2332-2339. Indeed, the oxidation of a face with a crystalline orientation (110) is quicker than that of a face with a crystalline orientation (100). Thus, the main surfaces, or most of the perimeter, of the channel, which correspond to surfaces with an orientation (100) are oxidised less quickly than those with an orientation (110) where the inner spacers are made.

Thus, two oxidation selectivity parameters are used in this method for making inner spacers: the composition of the oxidised material and the crystallography of the oxidised material.

A method for making the device 100 according to a second embodiment is described in connection with FIGS. 2A to 2D.

The initial stack 102 used in this second embodiment is similar to that used in the first embodiment.

Figure 2A:
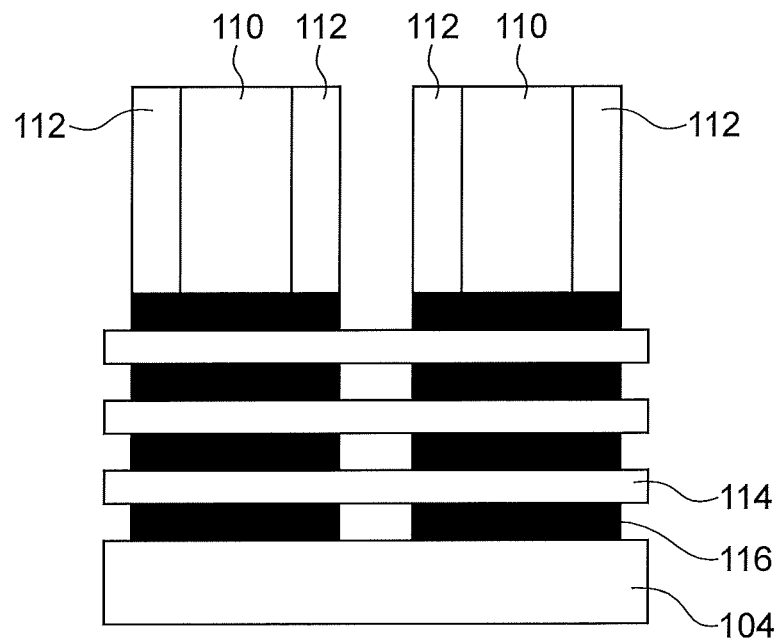
FIGS. 2A to 2D show some of the steps of a method for making a semiconductor device according to a second embodiment.

The steps previously described in connection with FIGS. 1A and 1B are first implemented. However, unlike the first embodiment in which the nanowires 114 are broken between two transistors, the etching of the stack 102 which is implemented is such that the nanowires 114 of the two transistors are here formed by continuous portions which are not broken at the future common source and drain region intended to be made for both these transistors. The structure obtained is shown in FIG. 2A.

As for the first embodiment previously described, a partial oxidation of the portions 116, from the surfaces forming the side flanks of the structures obtained by implementing the previous etching, is then implemented, forming the inner spacers 118.

Further, a part of the nanowires 114 is oxidised. Thus, oxidised portions 120 are formed at the ends of the nanowires 114.

Figure 2B:
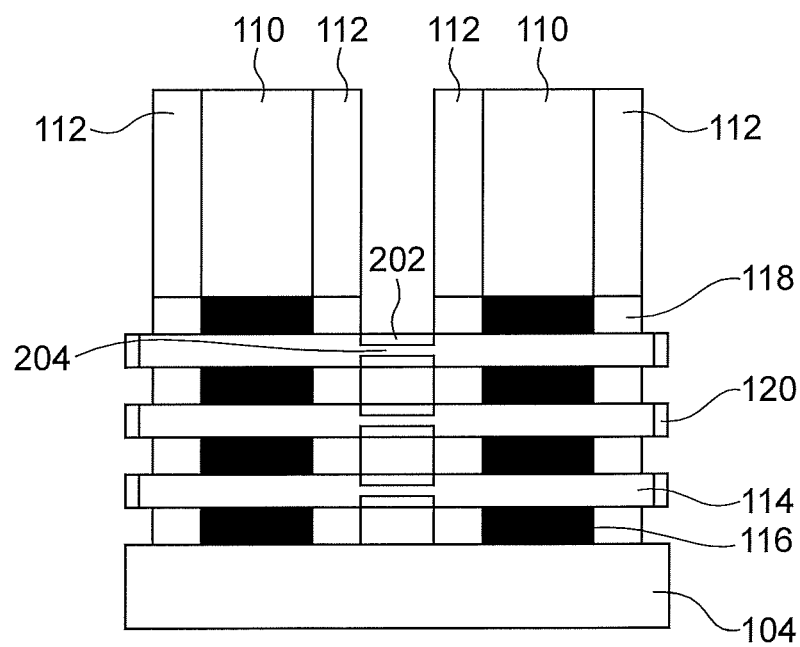

Given that the nanowires 114 are not broken between the transistors, the parts of the nanowires 114 present at the future common source and drain region are also partially oxidised, forming the oxide portions referred to as 202 in FIG. 2B. These oxide portions 202 surround the parts 204 of the nanowires 114 which have not been transformed into oxide.

Unlike the substrate 104 used in the first embodiment, the material of the substrate 104 used in this second embodiment is not likely to be oxidised, and no part of the substrate 104 is transformed into oxide. Alternatively, it is however possible to resort to a substrate 104 likely to be oxidised, as previously described for the first embodiment.

The parameters for implementing this oxidation can be similar to those previously described for the first embodiment.

The oxidised portions 120 and 202 formed around the nanowires 114 are removed by etching which also removes a similar oxide thickness of the inner spacers 118.

As previously, because the inner spacers 118 have been formed by implementing a same oxidation step and that the oxide thickness removed thereafter is similar for all the inner spacers 118, the inner spacers 118 obtained at the end of these steps are self-aligned with respect to each other.

Figure 2C:
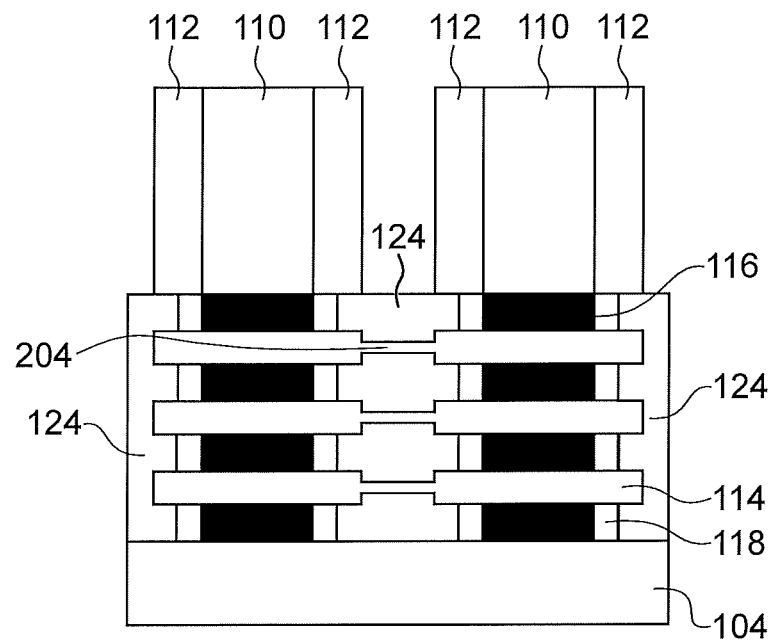

As shown in FIG. 2C, source and drain regions 124 are made via the implementation of an epitaxial growth. These regions 124 are advantageously made with an in situ doping so as to achieve a good junction quality. For example, doping the material of the regions 124 can be made with boron dopant atoms the concentration of which is for example between about $10^{18}$ and $10^{21}$ at/cm$^3$. The material of the source and drain regions 124 is for example SiGe:B for a P type transistor, or a material with a lattice parameter lower than that of silicon in order to introduce a tensile stress in the case of an N type transistor, as for example Si:C (1%).

In this second embodiment described herein, the parts 204 of the nanowires 114 present at the source and drain region common to both transistors also contribute to the SiGe epitaxial growth of this common source and drain region. Further, the presence of these parts 204 provides a stress in the channel region, thus improving electrical characteristics of the transistor.

Advantageously, a germanium diffusion present in the semiconductor of the parts 204 is implemented in order to increase the stress within the common source and drain region. This diffusion is achieved by implementing an adapted thermal annealing.

Figure 2D:
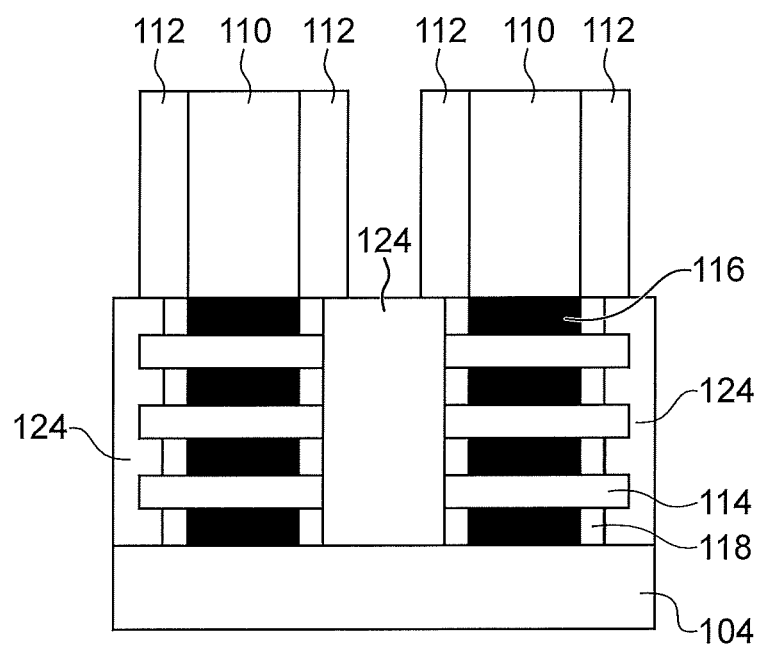

The structure obtained after this diffusion is shown in FIG. 2D.

The method according to this second embodiment is completed in a similar way to the first embodiment, that is depositing a packaging material onto the source and drain regions 124, by etching the dummy gates 110 and the portions 116, by making the definitive gates and then the electrical contacts of the transistors.

The different alternatives previously described for the first embodiment are applicable to the second embodiment.

A method for making the device 100 according to a third embodiment is described in connection with FIGS. 3A to 3I. In these Figs., making a single GAA-FET transistor is described.

The initial stack 102 used in this third embodiment is similar to that used in the first and second embodiments.

As in the first and second embodiments previously described, the stack 102 is first etched as one or more elongate portions (a single elongate portion being shown in FIG. 3A), and then a dummy gate 110 and temporary outer spacers 301 are then made on the elongate portion formed from the stack 102, without a subsequent etching of the parts of the stack 102 which are not covered with the temporary outer spacers 301.

Figure 3A:
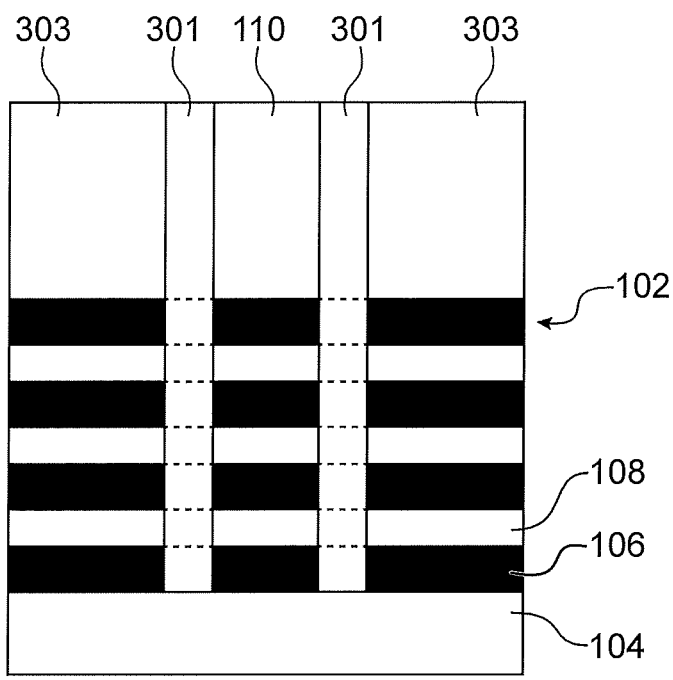
FIGS. 3A to 3I show some of the steps of a method for making a semiconductor device according to a third embodiment.

A packaging material 303 is then deposited onto the parts of the layers 106, 108 at which the future source and drain regions of the transistor will be made (FIG. 3A).

Figure 3B:
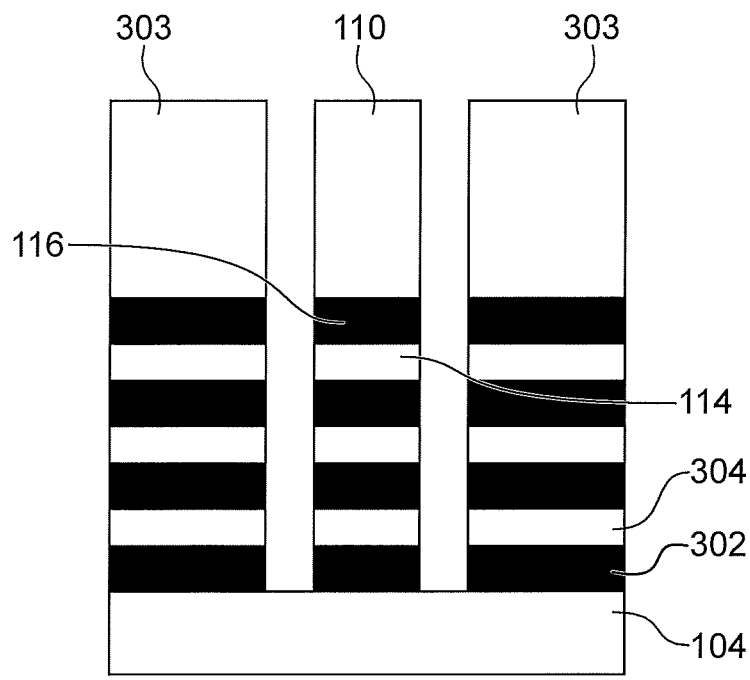

As shown in FIG. 3B, the temporary outer spacers 301 as well as the parts of the layers 106, 108 which are covered with the temporary outer spacers 301 are etched, for example by an RIE (Reactive Ion Etching). This etching forms accesses to the remaining parts 116 of the layers 106 from which the inner spacers 118 are intended to be made. This etching also defines the nanowires 114 intended to form the channel region of the transistor, as well as the remaining parts 116 of the layers 106 between which the nanowires 114 are arranged. The remaining parts of the layers 106, 108 which are covered with the packaging material 303 are referred to as 302 and 304.

Figure 3C:
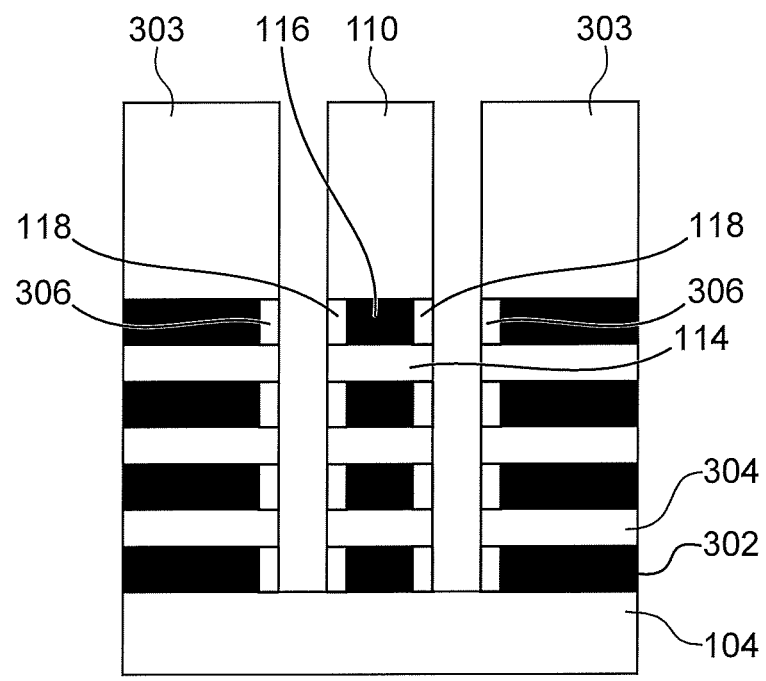

A partial oxidation of the portions 116, from the surfaces forming the side flanks of the portions 116 and revealed by the previous etching, is then implemented, forming the inner spacers 118. This oxidation also impacts the remaining parts 302 from the surfaces forming the side flanks of these remaining parts 302 and revealed by the previous etching, and forms oxidised portions 306 arranged facing the inner spacers 118 (FIG. 3C).

A controlled deoxidation step is then made in order to remove the oxide formed at the surface of the silicon of the nanowires 114.

Figure 3D:
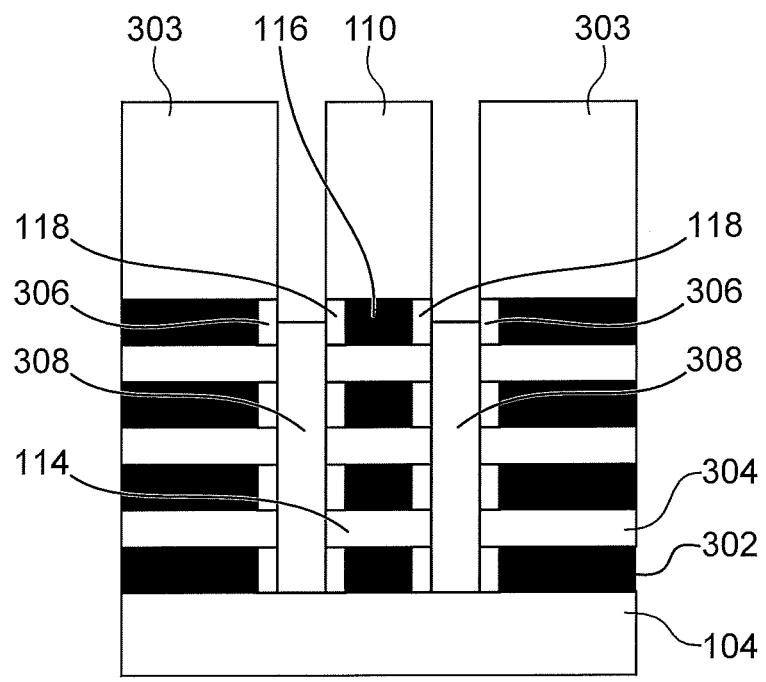

As shown in FIG. 3D, an epitaxial growth is implemented to form source and drain extension regions 308, from the ends of the nanowires 114. Advantageously, the semiconductor of the regions 308 is doped. In the exemplary embodiment shown in FIG. 3D, the epitaxial growth is implemented such that the regions 308 which are formed fill the entire space released by the etching of the parts of the layers 106, 108 previously covered with the temporary outer spacers 301, that is the space between the remaining parts 114, 116 and the remaining parts 302, 304 of the layers 106, 108.

According to a first alternative of this third embodiment, the epitaxial growth forming the extension regions 308 may be stopped as soon as the semiconductor portions formed by this epitaxial growth connect the nanowires 114 to the remaining portions 304 facing the nanowires 114. In this alternative shown in FIG. 3E, the epitaxial growth is implemented such that the regions 308 which are formed partially fill the space released by the etching of the parts of the layers 106, 108 previously covered with the temporary outer spacers 301. Remaining spaces are then located in front of the remaining parts 116 and 302 of the layers 106.

Regardless of whether the extension regions fully or partially fill the space released by the etching of the parts of the layers 106, 108 previously covered with the temporary outer spacers 301, the final outer spacers 112 are made on and around the extension regions 308.

Figure 3E:
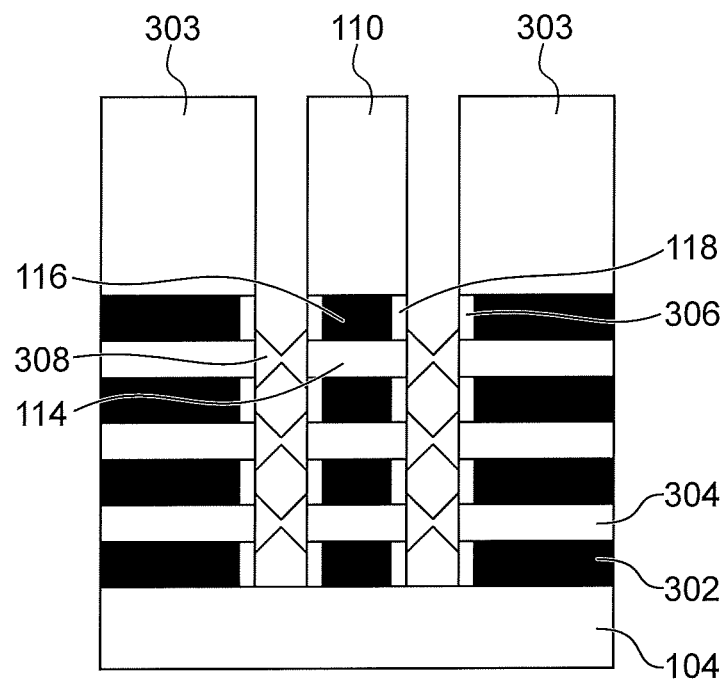
Figure 3F:
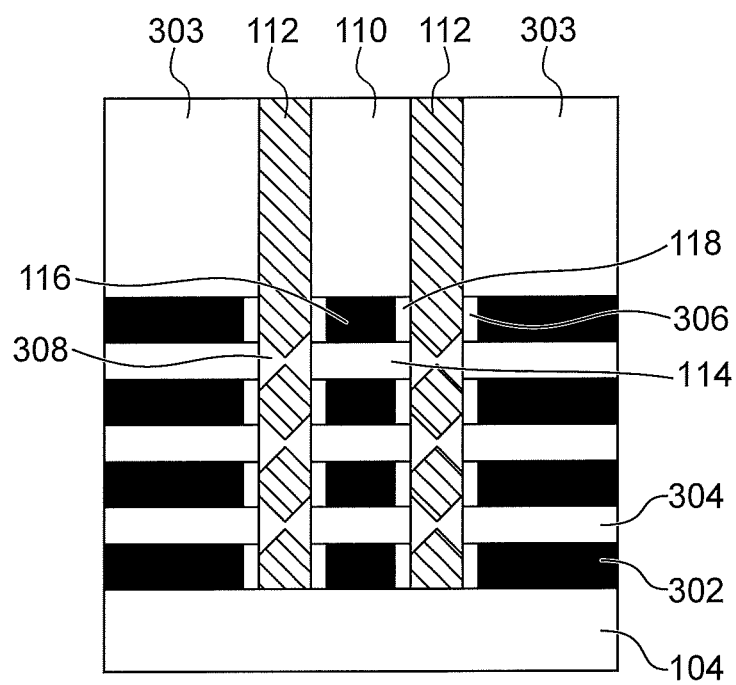
Figure 3G:
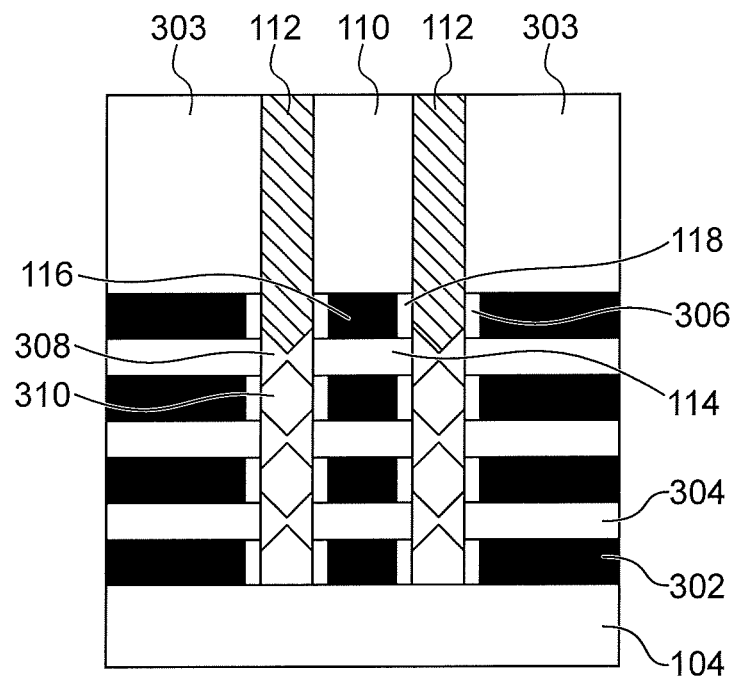
Figure 3H:
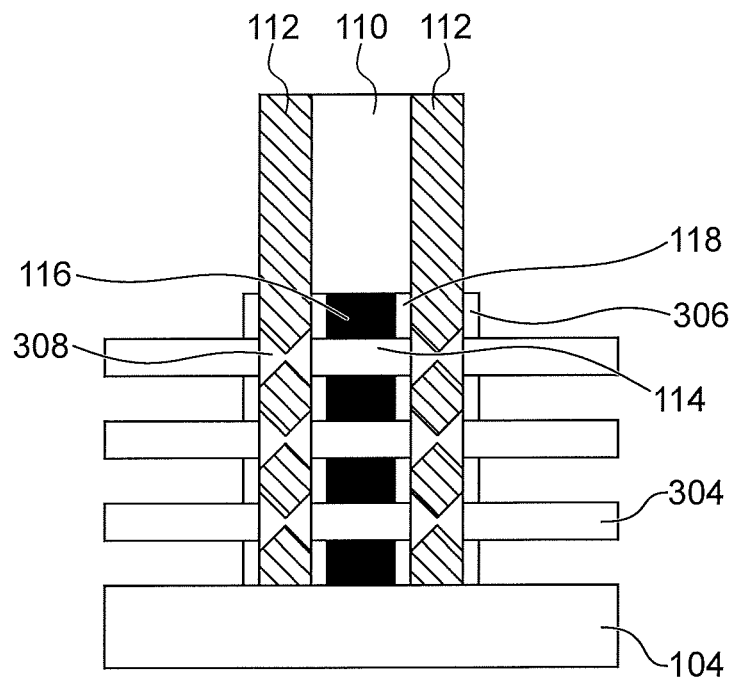

In the case of extension regions 308 made such as shown in FIG. 3E, a part of the material of the outer spacers 112 can be deposited between the semiconductor portions forming the extension regions 308. This configuration is shown in FIG. 3F. It is also possible that the material of the outer spacers 112 is deposited such that it remains located above the extension regions 308. In this case, cavities 310 are present between the extension regions 308, enabling a better electrical insulation to be achieved. This configuration is shown in FIG. 3G.

The packaging material 303 is then removed, and then the remaining parts 302 from the layers 106 are removed by etching. During this etching, the oxidised portions 306 protect the material of the extension regions 308 relative to the etching agents used (FIG. 3H, which corresponds to the configuration when the material of the outer spacers 112 is present between the portions of the extension regions 308).

In the absence of the cavities 310, the oxidised portions 306 can be removed.

Figure 3I:
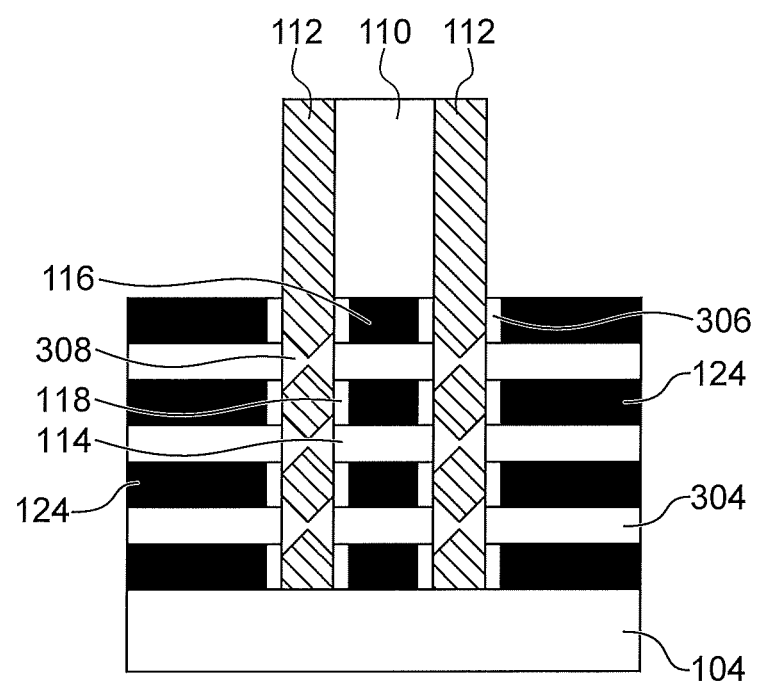

The source and drain regions 124 are then made by epitaxial growth from the semiconductor surfaces of the portions 304 (FIG. 3I). The semiconductor of the source and drain regions is advantageously SiGe comprising a germanium concentration higher than or equal to about 35% and doped with boron atoms, or even silicon doped by phosphorous atoms.

Making the device 100 is then completed by depositing the packaging material 126 onto the source and drain regions 124, etching the dummy gate 110, etching the portions 116, making the gate 128, and then removing the packaging material 126 and forming the electrical contacts 130, 132, as previously described for the previous embodiments.

The alternative embodiments previously described for the first and second embodiments are applicable to this third embodiment.

The invention claimed is:

1. A method for making a semiconductor device, including at least:
   a) making, on a substrate, a stack comprising at least one first semiconductor portion arranged between at least two second portions of at least one material able to be selectively etched relative to the semiconductor of the first portion, the first portion being able to form at least one active zone of the semiconductor device,
   b) making, on a part of the stack, outer spacers and at least one dummy gate arranged between the outer spacers,
   c) etching the second portions such that remaining parts of the second portions are arranged at least under the dummy gate,
   d) partially oxidising the remaining parts of the second portions from outer faces of the remaining parts of the second portions which are revealed by etching the second portions, forming inner spacers,
   e) removing the dummy gate and the non-oxidised parts of the remaining parts of the second portions arranged at least under the dummy gate,
   f) making a gate between the outer spacers and between the inner spacers, covering the channel and able to be electrically insulated from source and drain regions by the outer spacers and the inner spacers.

2. The method according to claim 1, wherein:
   step c) of etching is implemented such that the remaining parts of the second portions are also arranged under the outer spacers,
   the inner spacers are arranged at least partially under the outer spacers.

3. The method according to claim 1, further including, between steps d) and e), making the source and drain regions by epitaxially growing a semiconductor from at least parts of the first semiconductor portion.

4. The method according to claim 1, wherein implementing step c) also etches the first semiconductor portion such that a remaining part of the first semiconductor portion arranged at least under the dummy gate is preserved.

5. The method according to claim 1, wherein:
   step b) is implemented such that at least two dummy gates are made on the stack, each of the dummy gates being arranged between outer spacers,
   step c) is implemented such that at least part of the first semiconductor portion located between both dummy gates is not etched.

6. The method according to claim 1, wherein:
   the method further includes, between steps b) and c), implementing a deposition of a protective material covering parts of the stack which are not covered with the dummy gate and with the outer spacers, and then removing the outer spacers, named first outer spacers,
   implementing step c) also etches parts of the first semiconductor portion previously arranged under the first outer spacers,
   implementing step d) also makes a partial oxidation of the second remaining parts of the second portions covered with the protective material from outer faces of the second remaining parts of the second portions revealed by etching the second portions,
   and further including, between steps d) and e), implementing the following steps:
   epitaxially growing a semiconductor at least between a first part of the first semiconductor portion arranged under the dummy gate and second parts of the first semiconductor portion which are arranged under the protective material, forming source and drain extension regions, and then
   making second outer spacers at least on the source and drain extension regions, and then
   removing the protective material and the second remaining parts of the second portions, and then
   making the source and drain regions by epitaxially growing a semiconductor from at least the second parts of the first semiconductor portion.

7. The method according to claim 6, further including, between the step of removing the protective material and the step of making the source and drain regions, a step of removing at least part of oxidised portions from the second portions covered with the protective material.

8. The method according to claim 1, wherein the step d) of oxidising also makes a partial oxidation of the first semiconductor portion, the method further including, between steps d) and e), implementing an etching of oxidised parts of the first semiconductor portion.

9. The method according to claim 1, wherein the material of the second portions is able to be oxidised more quickly than the semiconductor of the first portion.

10. The method according to claim 9, wherein the semiconductor of the first portion is silicon or SiGe, and the material of the second portions is SiGe including a germanium proportion higher than that of the semiconductor of the first portion.

11. The method according to claim 3, wherein the semiconductor of the source and drain regions is compressive stressed SiGe when the semiconductor device corresponds to a P-type transistor.

12. The method according to claim 1, wherein the stack includes several first semiconductor portions each forming a nanowire arranged between two second portions.

13. The method according to claim 1, wherein the semiconductor device includes at least one GAA-FET transistor.

* * * * *